(12) United States Patent
Chen et al.

(10) Patent No.: US 10,342,140 B2
(45) Date of Patent: Jul. 2, 2019

(54) PRINTED CIRCUIT BOARD TO MOLDED COMPOUND INTERFACE

(71) Applicant: HEWLETT-PACKARD DEVELOPMENT COMPANY, L.P., Houston, TX (US)

(72) Inventors: Chien-Hua Chen, Corvallis, OR (US); Gary G. Lutnesky, Corvallis, OR (US); Michael W. Cumbie, Corvallis, OR (US); Eric L. Nikkel, Corvallis, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 61 days.

(21) Appl. No.: 15/571,015

(22) PCT Filed: Jul. 31, 2015

(86) PCT No.: PCT/US2015/043064
§ 371 (c)(1),
(2) Date: Oct. 31, 2017

(87) PCT Pub. No.: WO2017/023238
PCT Pub. Date: Feb. 9, 2017

(65) Prior Publication Data
US 2018/0168049 A1     Jun. 14, 2018

(51) Int. Cl.
*B41J 2/14* (2006.01)
*H05K 1/02* (2006.01)
(Continued)

(52) U.S. Cl.
CPC ............ *H05K 3/284* (2013.01); *B41J 2/1408* (2013.01); *B41J 2/14072* (2013.01);
(Continued)

(58) Field of Classification Search
CPC ........ H05K 3/284; H05K 3/46; H05K 1/0271; H05K 2201/068; H05K 2203/1327; B41J 2/1408; B41J 2/1637
See application file for complete search history.

(56) References Cited

U.S. PATENT DOCUMENTS

| 5,991,160 A | 11/1999 | Lumbard |
| 6,758,200 B2 | 7/2004 | Hageman et al. |

(Continued)

FOREIGN PATENT DOCUMENTS

| CN | 1574304 | 2/2005 |
| CN | 1765161 | 4/2006 |

(Continued)

*Primary Examiner* — Hoa C Nguyen
(74) *Attorney, Agent, or Firm* — HP Inc. Patent Department (57) ABSTRACT

A printed circuit board has a first coefficient of thermal expansion. A compound is molded about the printed circuit board. The compound has a second coefficient of thermal expansion different than the first coefficient of thermal expansion. An interface is between an edge of the printed circuit board and the compound. The interface has a third coefficient of thermal expansion between the first coefficient of thermal expansion and the second coefficient of thermal expansion.

15 Claims, 4 Drawing Sheets

(51) Int. Cl.
  *H05K 3/28* (2006.01)
  *H05K 1/18* (2006.01)
  *H05K 3/46* (2006.01)
  *B41J 2/16* (2006.01)

(52) U.S. Cl.
  CPC ........... *B41J 2/1603* (2013.01); *B41J 2/1626* (2013.01); *B41J 2/1632* (2013.01); *B41J 2/1637* (2013.01); *B41J 2/1643* (2013.01); *H05K 1/0271* (2013.01); *H05K 1/181* (2013.01); *H05K 3/46* (2013.01); *H05K 2201/068* (2013.01); *H05K 2203/1327* (2013.01)

(56) References Cited

U.S. PATENT DOCUMENTS

| | | | |
|---|---|---|---|
| 7,105,919 | B2 | 9/2006 | Kim |
| 2002/0041310 | A1* | 4/2002 | Kaneko ................ B41J 2/14024 347/65 |
| 2004/0051762 | A1* | 3/2004 | Nishi .................. B41J 2/14209 347/68 |
| 2006/0181580 | A1* | 8/2006 | Lee ...................... B41J 2/14233 347/68 |
| 2007/0009718 | A1 | 1/2007 | Kanda |
| 2010/0097775 | A1* | 4/2010 | Kashiwazaki .......... H01L 24/49 361/783 |
| 2012/0033017 | A1* | 2/2012 | Iwanaga ............... B41J 2/14024 347/54 |
| 2012/0287582 | A1* | 11/2012 | Vinciarelli ............. H01R 43/24 361/728 |
| 2013/0193592 | A1* | 8/2013 | Peil ........................... F21K 9/00 257/791 |
| 2013/0201249 | A1* | 8/2013 | Hamada ..................... B41J 2/01 347/20 |
| 2014/0144686 | A1 | 5/2014 | Shimizu |
| 2014/0233188 | A1* | 8/2014 | Terasawa ............... H05K 7/1432 361/719 |
| 2014/0285581 | A1 | 9/2014 | Drury et al. |
| 2014/0355218 | A1* | 12/2014 | Vinciarelli ........... H01R 43/205 361/728 |
| 2016/0150655 | A1* | 5/2016 | Takenaka ............. H05K 5/0056 361/709 |
| 2017/0028722 | A1 | 2/2017 | Chen et al. |

FOREIGN PATENT DOCUMENTS

| | | |
|---|---|---|
| CN | 101193497 | 6/2008 |
| CN | 201386734 | 1/2010 |
| CN | 102668726 | 9/2012 |
| CN | 103119702 | 5/2013 |

\* cited by examiner

PRINTED CIRCUIT BOARD TO MOLDED COMPOUND INTERFACE

BACKGROUND

Printed circuit boards are used to electrically interconnect various electronic components. In some applications, the printed circuit boards are encased in a molded compound which facilitates mounting of the printed circuit boards and which supports the printed circuit boards relative to other devices which may also be encased by the molded compound.

DETAILED DESCRIPTION OF EXAMPLES

Figure 1:
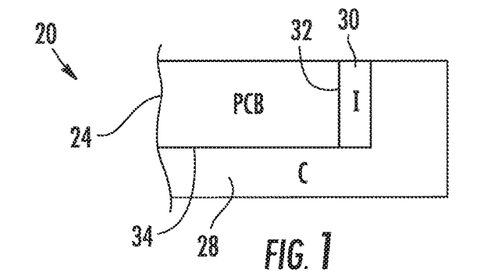
FIG. 1 is a sectional schematic diagram of an example printed circuit board to molded compound interface architecture.

FIG. 1 schematically illustrates an example printed circuit board to molded compound interface architecture 20. In many applications, a printed circuit board may be subjected to fluids. Due to differences in the thermal coefficients of the printed circuit board and a compound encasing the printed circuit board, the juncture of the printed circuit board and the compound undergo stress and may separate, creating a passage along which the fluids may travel or diffuse, allowing the fluids to possibly undesirably contact electrical traces or electronics on the printed circuit board. As many printed circuit boards often include multiple layers or laminations, the edges of the printed circuit board are especially susceptible to such fluid seepage or diffusion between the layers or laminations.

As will be described hereafter, architecture 20 provides an interface between the printed circuit board and the molded compound. The interface has a coefficient of thermal between intermediate that the printed circuit board and the molded compound. As a result, stress at the juncture of the printed circuit board the molded compound is reduced to reduce likelihood of the juncture of the printed circuit board the molded compound separating. In addition, the chance that fluids will undesirably seep between the printed circuit board and the molded compound is diminished.

As schematically shown by FIG. 1, architecture 20 comprises printed circuit board 24, compound 28 and interface 30. Printed circuit board (PCB) 24 comprises a platform that mechanically support electronic components using conductive tracks or traces, pads and other features. In one implementation, printed circuit board 24 comprises a nonconductive substrate upon which an electrically conductive sheet is laminated and etched or otherwise patterned to form tracks or traces, pads and other features. In one implementation, the electrically conductive sheet comprises a sheet of copper. In one implementation, printed circuit board 24 comprises multiple layers or laminations of nonconductive substrates and electrically conductive traces.

In one implementation, printed circuit board 24 comprises a fire retardant 4 (FR4) printed circuit board, wherein FR4 is a glass fiber epoxy laminate. In one implementation, the glass fiber epoxy laminate comprises core layers comprising a glass fiber material upon which electrically conductive traces are formed, wherein the core layers are laminated to one another by intermediate prepreg layers, epoxy coated glass fabric layers. In such an implementation, the FR4 printed circuit board may have a coefficient of thermal expansion of approximately 50 ppm/C or higher along a z-axis (an axis perpendicularly extending through the layers or perpendicular to the face of the printed circuit board).

In yet other implementations, printed circuit board 24 may be formed from other core materials which are laminated to one another using other glues, adhesives or epoxies. For example, in another implementation, printed circuit board 14 may comprise a composite epoxy material (CEM) printed circuit board, wherein the glass fiber fabric layers or cores are laminated to one another by a laminated paper. In each of such cases, printed circuit board 24 has a coefficient of thermal expansion different than that of compound 28.

Compound 28 comprises a material molded about printed circuit board 24 and having a coefficient of thermal expansion different than that of printed circuit board 24. Compound 28, when molded about printed circuit board 24, is in a liquid or semi-liquid state, flowing and/or being shaped about printed circuit board 24, assuming the shape of those portions of printed circuit board 24 or other structures extending from printed circuit board 24 which are contacted by compound 28. In the example illustrated, compound 28 extends into conformal contact with an underside of printed circuit board 24. Compound 28 extends into conformal contact with interface 30 along an edge of printed circuit board 24, wherein but for interface 30, compound 28 would extend into conformal contact with the edge of printed circuit board 24.

In one implementation, compound 28 comprises an epoxy molding or molded compound. In such an implementation, compound 28 comprises a blend or mixture of epoxy resins and curing agents intimately combined with fillers, reinforcements, colorants and other chemical agents. In one implementation, compound 28 comprises CEL400ZHF40WG epoxy mold compound from Hitachi having a coefficient of thermal expansion of approximately 7 ppm/C in or along the z-axis. in other implementations, compound 28 may comprise other epoxy mold compound or other compounds in general.

Interface 30 comprises a structure extending between printed circuit board 24 and compound 28, wherein the structure has a coefficient of thermal expansion between that of the printed circuit board 24 and compound 28. Because the structure has a coefficient of thermal expansion between that of printed circuit board 24 and compound 28, interface 30 reduces coefficient of thermal expansion mismatches along the z-axis and serves as a barrier to fluid diffusion into printed circuit board 24. By reducing coefficient of thermal expansion mismatches, interface 30 reduces induced stresses at the juncture of printed circuit board 24 and compound 28. As a result, the likelihood of the juncture of the printed circuit board and the molded compound separating is reduced, diminishing the chance that fluids will undesirably seep or diffuse between the printed circuit board and the molded.

In the example illustrated, interface 30 contacts an edge 32 of printed circuit board 24 on one side and contacts compound 28 on the other side. The edge 32 extends in a plane where the edges of each of the core layers also lie. In one implementation, interface 30 conformally contacts the edge 32 of printed circuit board 24, matching the shape of the edge 32 of printed circuit board 24.

In one implementation, interface 30 comprises a metal plated along the edge of printed circuit board 24. In one implementation, interface 30 comprises copper plated along the edge 32 of printed circuit board 24, wherein the copper has a coefficient of thermal expansion of approximately 17 ppm/C in the z-axis. In another implementation, interface 30 comprises an epoxy having a coefficient of thermal expansion less than that of the printed circuit board 24 and greater than that of the compound 28. In one implementation, the epoxy is coated upon the edge of the printed circuit board 24. In another implementation, the epoxy is backfilled into a gap provided between the edge 32 of printed circuit board 24 and compound 28.

Although interface 30 is illustrated as extending along an edge of printed circuit board 24, in other implementations, interface 30 may additionally extend along other edges 32 of printed circuit board 24. In one implementation, interface 30 extends along all of the edges 32 of printed circuit board 24. In some implementations, interface 30 extends along or across a face 34 or multiple faces 34 of printed circuit board 24 as well.

Figure 2:
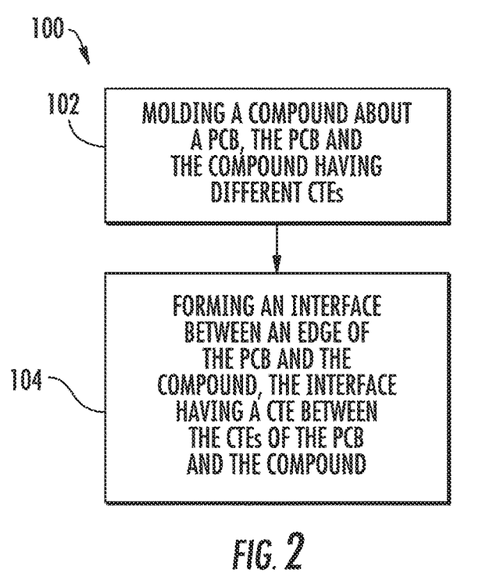
FIG. 2 is a flow diagram of an example method for forming the architecture of FIG. 1.

FIG. 2 is a flow diagram of an example method 100 for forming a print head to molded compound interface, such as architecture 20 described above. As indicated by block 102, a compound, such as compound 28, is molded about a printed circuit board, such as printed circuit board 24. The printed circuit board and the compound have different coefficients of thermal expansions. As indicated by block 104, an interface is formed between an edge of the printed circuit board and the compound. The interface has a coefficient of thermal expansion between that of the printed circuit board and the compound. In one implementation, the interface is formed between the printed circuit board and the compound by being plated, coated or otherwise deposited onto the edge of the printed circuit board prior to molding of the compound about the printed circuit board and the formed interface. In another implementation, a gap is formed between the edge of the printed circuit board the compound. This gap may be formed as part of the molding of the compound or may be provided by removing portions of the compound or edge portions of the printed circuit board after molding. The interface is subsequently formed by inserting the interface into the gap or filling the gap with the material or materials of the interface that have a coefficient of thermal expansion between that of the printed circuit board and the compound.

Figure 3:
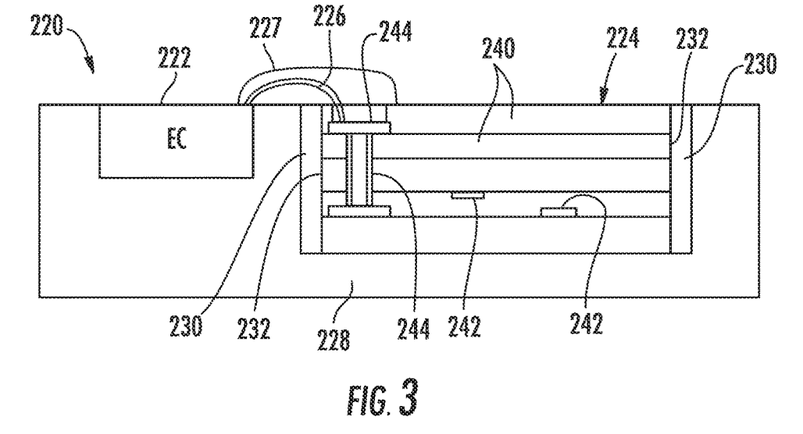
FIG. 3 is a sectional schematic diagram of another example printed circuit board to molded compound interface architecture.

FIG. 3 schematically illustrates an apparatus or architecture 220, another example of the architecture shown in FIG. 1. Architecture 220 comprises electronic component 222, printed circuit board 224, electrical interconnect 226, compound 228 and interface 230. Electronic component 222 comprises a device held in place and supported by compound 228 proximate to printed circuit board 224. In one implementation, electronic component 222 receives power and/or control signals transmitted by printed circuit board 224.

In one implementation, electronic component 222 comprises a component that exposes architecture 220 to fluid or other foreign contaminants. In one implementation, electronic part 222 comprises a fluid droplet ejection die or printing element. In one implementation, electronic component 222 comprises a thermal fluid droplet ejection print head die having thermal fluid droplet ejection resistors which generate sufficient heat to nucleate adjacent fluid, creating a bubble that forcefully expels surrounding fluid out of a firing chamber and through a nozzle. In yet other implementations, electronic component 222 may comprise other types of fluid droplet ejection drop ejection devices or other electronic components for other purposes.

Printed circuit board 224 is similar to printed circuit board 24 described above. Print circuit board 224 is specifically illustrated as comprising multiple layers 240 stacked or laminated to one another. Electrically conductive lines or traces 242 are formed upon and extend along the surface of the layers or laminations. Electrically conductive lines or traces on different layers are interconnected by electrically conductive vias 244. Electrical communication or contact with external components, such as electronic component 222, is facilitated by the electrical contact pads such as contact pad 244.

In one implementation, printed circuit board 224 comprises a fire retardant 4 (FR4) printed circuit board, wherein FR4 is a glass fiber epoxy laminate. In one implementation, the glass fiber epoxy laminate comprises core layers comprising a glass fiber material upon which electrically conductive traces are formed, wherein the core layers are laminated to one another by intermediate prepreg layers, epoxy coated glass fabric layers. In such an implementation, the FR4 printed circuit board may have a coefficient of thermal expansion of approximately 50 ppm/C or higher along a z-axis (an axis perpendicularly extending through the layers or extending perpendicular to the face of the printed circuit board).

In yet other implementations, printed circuit board 24 may be formed from other core materials which are laminated to one another using other glues, adhesives or epoxies. For example, in another implementation, printed circuit board 224 may comprise a composite epoxy material (CEM) printed circuit board, wherein the glass fiber fabric layers or cores are laminated to one another by a laminated paper. In each of such cases, printed circuit board 224 has a coefficient of thermal expansion different than that of compound 228.

Electrical interconnect 226 comprises a flexible circuit or wire electrically interconnecting electronic component 222 and printed circuit board 224. In one implementation, electrical interconnect 226 is encapsulated by a by covering 227. In one implementation, the covering comprises a dielectric material such as encap epoxy.

Compound 228 is similar to compound 28 described above. Compound 228 comprises a material continuously molded about electronic component 222 and printed circuit board 224. Compound 228 holds and retains electronic opponent 222 and printed circuit board 224 relative to one another. Compound 228 has a coefficient of thermal expansion different than that of printed circuit board 224. Compound 228, when molded about electronics opponent 222 and printed circuit board 224, is in a liquid or semi-liquid state during mold process, flowing and/or being shaped about printed circuit board 224, assuming the shape of those portions of printed circuit board 224 or other structures extending from printed circuit board 224 which are contacted by compound 228. In the example illustrated, compound 228 extends into conformal contact with an underside of printed circuit board 224. Compound 228 extends into conformal contact with interface 230 along the edges 232 of printed circuit board 224, wherein but for interface 230, compound 228 would extend into conformal contact with the edge of printed circuit board 224.

In one implementation, compound 28 comprises an epoxy molding or molded compound. In such an implementation, compound 28 comprises a blend or mixture of epoxy resins and curing agents intimately combined with fillers, reinforcements, colorants and other chemical agents. In one implementation, compound 28 comprises CEL400ZHF40WG epoxy mold compound from Hitachi having a coefficient of thermal expansion of approximately 7 ppm/C in the z-axis. in other implementations, compound 228 may comprise other epoxy mold compound or other compounds in general.

Interface 230 comprises a structure extending between printed circuit board 224 and compound 228, wherein the structure has a coefficient of thermal expansion between that of the printed circuit board 224 and compound 228. Because the structure has a coefficient of thermal expansion between that of printed circuit board 224 and compound 228, interface 230 reduces thermally induced stresses at the juncture of printed circuit board 224 and compound 228. As a result, the likelihood of the juncture of the printed circuit board and the molded compound separating is reduced, diminishing the chance that fluids will undesirably seep or diffuse between the printed circuit board and the molded.

In the example illustrated, interface 230 extends completely about printed circuit board 224, contacting all of the edges 232 of printed circuit board 224 on one side and contacting compound 228 on the other side. The edges 232 extend in a planes where the edges of each of the core layers also lie. In one implementation, interface 230 conformally contacts the edges 232 of printed circuit board 24, matching the shape of the edges 232 of printed circuit board 224. In other implementations, interface 230 contacts a portion of the total number of edges of printed circuit board 224.

In one implementation, interface 230 comprises a metal plated along the edge of printed circuit board 224. In one implementation, interface 230 comprises copper plated along the edges 232 of printed circuit board 224, wherein the copper has a coefficient of thermal expansion of approximately 17 ppm/C in the z-axis. In another implementation, interface 230 comprises an epoxy having a coefficient of thermal expansion less than that of the printed circuit board 224 but greater than that of the compound 228. In one implementation, the epoxy is coated upon the edge of the printed circuit board 224. In another implementation, the epoxy is backfilled into a gap provided between the edges 232 of printed circuit board 224 and compound 228.

Figure 4:
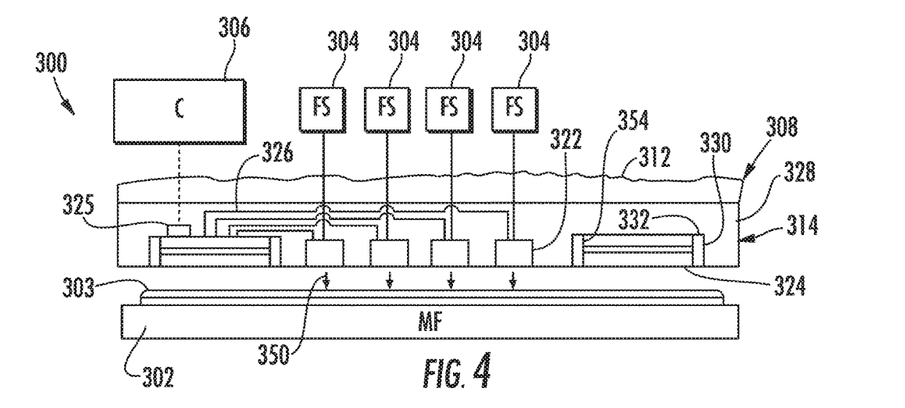
FIG. 4 is a sectional schematic diagram of an example printing system.

FIG. 4 schematically illustrates an example printing system 300 employing architecture 220 described above. Printing system 300 comprises media feed 302, fluid supplies 304, controller 306 and print bar 308. Media feed 302 comprises a device to move media, such as sheets or webs of paper, into position for being printed upon by print bar 308. In one implementation, media feed 302 comprises one or more rollers by which sheets or webs of media 303 are driven and moved relative to print bar 308.

Fluid supplies 304 supply fluid, such as ink, to different fluid droplet ejection dies supported by print bar 308. In one implementation, fluid supplies 304 supply different types of fluid to their respective dies. For example, in one implementation, fluid supplies 304 supply black, cyan, magenta and yellow inks to their respective associated dies. In one implementation, fluid supplies 304 are carried by print bar 308. In another implementation, fluid supplies 304 are "off-axis", located remote respect to print bar 308, wherein fluid is supplied through one or more conduits.

Controller 306 comprises electronics that output control signals controlling the ejection of the fluid from each of the dies on print bar 308. In the example illustrated, controller 306 outputs electric control signals which are transmitted to a processor chip or application-specific integrated circuit (ASIC) supported by print bar 308, wherein the processor chip or ASIC outputs electric signals to the dies based upon the control signals received from controller 306. The control signals transmitted to the dies cause the fluid, such as ink, to be selectively deposited in a predetermined image or pattern upon the print media 303 moved by media feed 302.

Print bar 308 comprises a structure utilizing one example of the architecture 220 described above to support and position electronic components, in the form of print head dies and a printed circuit board. In one implementation, print bar 308 is stationary supported opposite to media feed 302 to facilitate page wide printing. In another implementation, print bar 308 is carried by a carriage, wherein the carriages scanned across the media 303 during printing. Print bar 308 comprises body 312 and print head assembly 314. Body 312 comprise a structure to which print head assembly 314 is mounted.

Print head assembly 314 comprises drop-on-demand print head dies 322, printed circuit board 324, ASIC 325, electrical interconnects 326 (schematically shown), compound 328 and interface 330. Dies 322 comprise devices to selectively eject droplets of fluid, such as ink. Dies 320 receive fluid from respective fluid sources 304 and eject the fluid onto media 303 as indicated by arrows 350.

Printed circuit board 324 is similar to printed circuit board 224 described above. Printed circuit board 324 comprises an opening 354 in which dies 322 are encapsulated by compound 328. ASIC 325 comprises a processing chip supported by printed circuit board 324. ASIC 325 receives control signals from controller 306 and, based upon such control signals, generates and transmits appropriate control signals to each of dies 322. In one implementation, ASIC 325 may comprise a field programmable gate array.

Compound 328 is similar to compound 228 described above. Compound 328 encapsulates each of dies 322 within opening 354, printed circuit board 324 and ASIC 325. Interface 330 is similar to interface 230 described above. Interface 330 extends between the edges of printed circuit board 324 and compound 328. Interface 330 has a coefficient of thermal expansion between that of printed circuit board 324 and compound 328. Because interface 330 has a coefficient of thermal expansion between that of printed circuit board 324 and compound 328, interface 330 reduces coefficient of thermal expansion mismatches along the z-axis and serves as a barrier to fluid diffusion into printed circuit board 324. By reducing coefficient of thermal expansion mismatches, interface 330 reduces thermally induced stresses at the juncture of printed circuit board 324 and compound 328. As a result, the likelihood of the juncture of the printed circuit board and the molded compound separating is reduced, diminishing the chance that fluids will undesirably seep or diffuse between the printed circuit board and the molded.

In the example illustrated, interface 330 contacts edges 332 of printed circuit board 324 on one side and contacts compound 328 on the other side. The edges 332 extend in a plane where the edges of each of the core layers also lie. In one implementation, interface 330 conformally contacts the edge 332 of printed circuit board 324, matching the shape of the edge 332 of printed circuit board 324.

In one implementation, interface 330 comprises a metal plated along the edge of printed circuit board 324. In one implementation, interface 330 comprises copper plated along the edge 332 of printed circuit board 324, wherein the copper has a coefficient of thermal expansion of approximately 17 ppm/C in the z-axis. In another implementation, interface 330 comprises an epoxy having a coefficient of thermal expansion less than that of the printed circuit board 324 the greater than that of the compound 328. In one implementation, the epoxy is coated upon the edge of the printed circuit board 324. In another implementation, the epoxy is backfilled into a gap provided between the edge 332 of printed circuit board 324 and compound 328.

Figure 5:
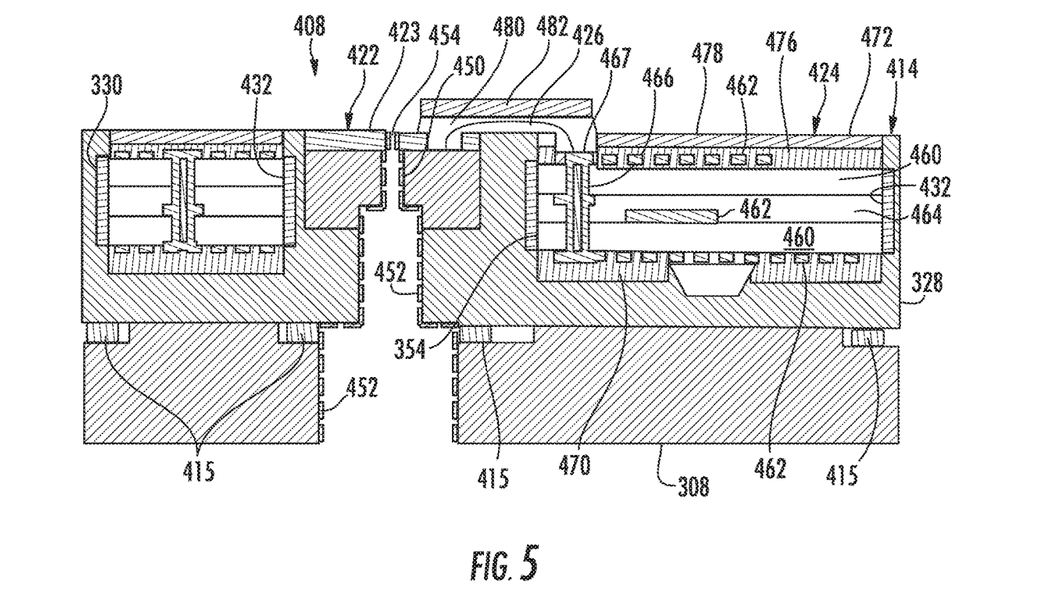
FIG. 5 is a sectional view of an example print bar of the printing system of FIG. 4.

FIG. 5 is a sectional view illustrating print bar 408, one example of print bar 308 described above. As shown by FIG. 5, print bar 408 comprises body 308 and print head assembly 414. Print head assembly 414 is secured to body 308 by structural adhesive 415.

Print head assembly 414 similar print head assembly 314 except that print head assembly 414 is specifically illustrated as comprising fluid droplet ejection die 422, printed circuit board 424, electrical interconnect 426, compound 328 and interface 330 (described above). In the example illustrated, die 422 comprises a silicon thermal fluid droplet ejection die that ejects fluid, such as ink, through a nozzle plate 423 formed from a material such as Bisphenol A Novolac epoxy (SU8). Die 422 includes a fluid slot 450 which receives fluid through fluid passages 452 and 454 within compound 328 and body 308, respectively. In one implementation, die 422 comprises multiple firing chambers extending along slot 450, wherein each firing chamber contains a thermal fluid droplet ejection firing resister to selectively eject fluid through one of nozzles 454 of nozzle plate 423. Die 422 is encapsulated by compound 328. In other implementations, die 422 may comprise other types of fluid droplet ejection devices such as piezoresistive fluid droplet ejection devices.

Print circuit board 424 transmits electrical signals and power to die 422. Print circuit board 424 comprises core layers 460, traces 462, binding layers 464, solder mask 470 and cover lay 472. Core layers 460 comprise dielectric layers upon which are formed or patterned electrically conductive traces 462. In one implementation in which printed circuit board 424 comprises an FR4 printed circuit board, core layers 460 comprise a glass fiber fabric. Although FIG. 5 illustrates two core layers and one intermediate binding layer 464 for ease of illustration, in other implementations, printed circuit board 424 may comprise additional core layers and associated traces 462 as well as additional binding layers 464.

Traces 462 are formed from metals, such as copper. In one implementation, traces 462 are formed by etching a copper sheet plated upon core layers 460. Binding layers 464 comprise layers that join core layers 460 and encapsulate traces 462. In one implementation in which printed circuit board 424 comprises an FR4 printed circuit board, binding layers 460 comprise prepreg, an epoxy coated glass fabric. In other implementations, binding layer 464 may comprise a laminated paper such as with a CEM printed circuit board.

Electrically conductive via 466 extends through core layers 460 and provides electrical connection between election conductive traces 462 of different layers 460. In one implementation, electrically conductive via 466 is formed by drilling through layers 460, 464 and plating copper within such drilled apertures. Electrically conductive via 46 terminates at a contact pad 467 for electrical interconnect 426.

Solder mask 470, also sometimes referred to as a solder stop mask or solder resist, comprises a thin lacquer-like layer of polymer applied over copper traces 462 to protect copper traces 462 against oxidation and prevent solder bridges from forming between closely placed solder pads. Cover lay 472 comprises layers of materials deposited upon the traces 462 to protect the traces 462 of printed circuit board 424 against oxidation. In the example illustrated, cover lay 472 comprises a film adhesive layer 476 and a polyimide layer 478. In other implementations, other layers may be utilized to protect otherwise exposed traces 462 against oxidation.

Electrical interconnect 426 comprise a wire or other electrical interconnecting structure extending from contact pad 467 to die 422. In the example illustrated, electrical interconnect 426 is encapsulated by a dielectric encap layer 480 and an overlying encap film 482.

As described above, compound 328 encapsulates die 422 and printed circuit board 424. Interface 330 extends about edges 432 of printed circuit board 424, namely core layers 460 and binding layers 464. Interface 330 has a coefficient of thermal expansion between that of printed circuit board 424 and compound 328 in the z-axis, reducing coefficient of thermal expansion mismatches along the z-axis and serving as a barrier to fluid diffusion into printed circuit board 324. By reducing coefficient of thermal expansion mismatches, interface 330 reduces induced stresses at the juncture of printed circuit board 424 and compound 328. As a result, the likelihood of the juncture of the printed circuit board and the molded compound separating is reduced, diminishing the chance that fluids will undesirably seep between the printed circuit board and the molded.

Figure 6:
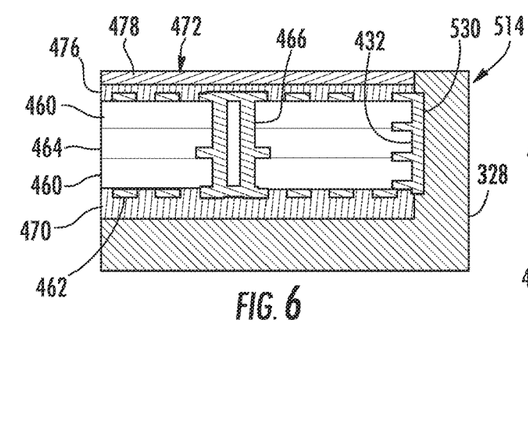
FIG. 6 is a sectional view of an example print head assembly of the print bar of FIG. 5 for use as part of the printing system of FIG. 4.

FIGS. 6-11 are section views illustrating various example interfaces used with printed circuit board 424 and print head assembly 414 described above. FIG. 6 illustrates portions of print head assembly 514 for use as part of printing system 300. Print head assembly 514 is similar to print head assembly 414 described above except that print head assembly 514 comprises interface 530. Interface 530 comprises a metal, such as copper, having a thermal coefficient between that of printed circuit board 424 and compound 328 plated or otherwise deposited along edges 432 of printed circuit board 424. In some implementations, additional coatings or layers of other metals, such as palladium, tantalum or the like may deposited over the copper layer of interface 530.

Figure 7:
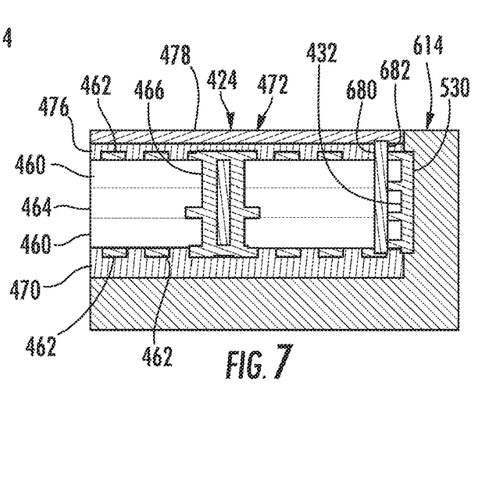
FIG. 7 is a sectional view of an example print head assembly of the print bar of FIG. 5 for use as part of the printing system of FIG. 4.
Figure 8:
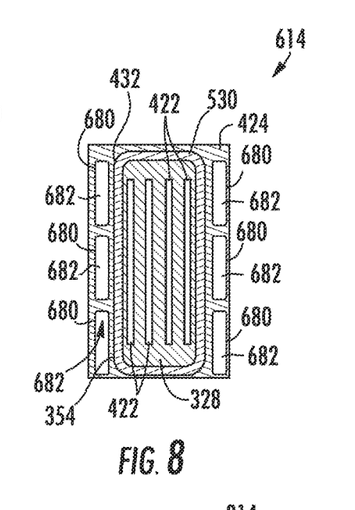
FIG. 8 is a top view of the print head assembly of FIG. 7.

FIGS. 7 and 8 illustrate portions of print head assembly 614 for use as part of printing system 300. Print head assembly 614 is similar to print head assembly 514 described above except that print head assembly 614 additionally comprises slots 680 and fillers 682. As with print head assembly 514, print head assembly 614 comprises interface 530. In other implementations, print head assembly 614 may comprise other types of interfaces such as coated epoxies.

Slots 680 comprise channels or passages formed through printed circuit board 424 proximate to edges 432 of printed circuit board 424. In one implementation, slots 680 are formed within all of edges 432. As shown by FIG. 8, slots 680 are intermittently spaced about printed circuit board along edges 432 of printed circuit board 424. Although illustrated as extending along the longer dimension of opening 354 of printed circuit board 424, in other implementations, slots 680 may additionally or alternatively extend along the shorter dimensions of opening 354 of printed circuit board 424.

Fillers 682 comprise volumes of material having a low elastic modulus relative to the elastic modulus of printed circuit board 424, namely, the core layers 460. Fillers 682 fill or occupy slots 680. Fillers 682 relieve stress along edge 432 of printed circuit board 424.

In one implementation, fillers 682 have an elastic modulus less than 100 MPa. In one implementation, fillers 682 comprises an elastomer, which prior to curing, is in a liquid form. In one implementation, filler 682 comprise an elastomer such as SIFEL2618 commercially available from Shin-Etsu. In yet other implementations, fillers 682 may comprise other soft or elastomeric materials.

Figure 9:
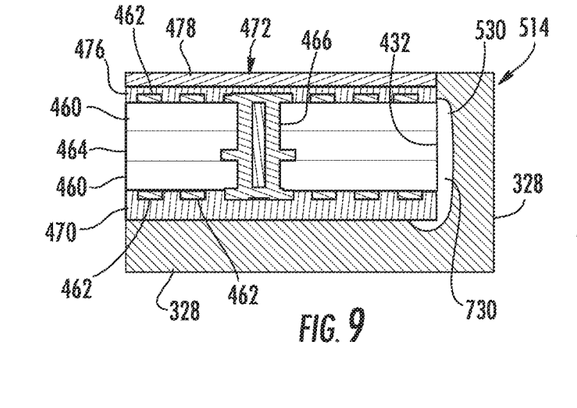
FIG. 9 is a sectional view of an example print head assembly of the print bar of FIG. 5 for use as part of the printing system of FIG. 4.

FIG. 9 is a section view illustrating portions of print head assembly 714 for use as part of printing system 300. Print head assembly 714 is similar to print head assembly 414 described above except that print head assembly 514 comprises interface 730. Interface 530 comprises a nonmetal or polymer, such as an epoxy, having a thermal coefficient between that of printed circuit board 424 and compound 328 and coated or spread coated along edges 432 of printed circuit board 424. Interface 730 serves as a stress buffer as well as an adhesion layer for the compound 328. In one implementation, interface 530 comprises an epoxy such as EW8063 from Polysciences, Inc. having a coefficient of thermal expansion of approximately 12 ppm/C.

Figure 10:
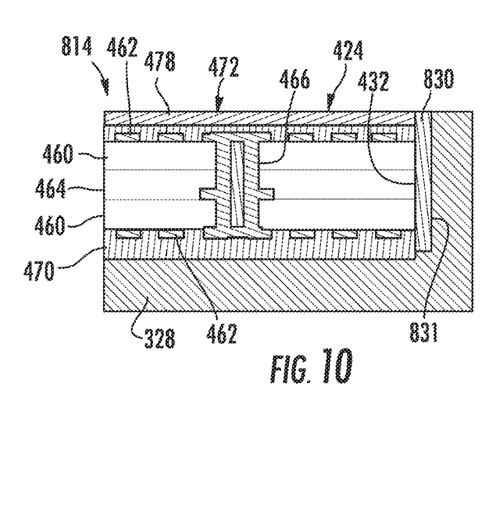
FIG. 10 is a sectional view of an example print head assembly of the print bar of FIG. 5 for use as part of the printing system of FIG. 4.
Figure 11:
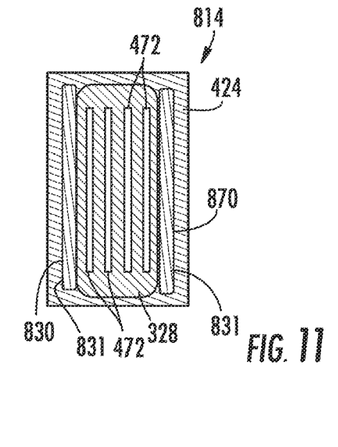
FIG. 11 is a top view of the print head assembly of FIG. 10.

FIGS. 10 and 11 illustrate portions of print head assembly 814 for use as part of printing system 300. Print head assembly 814 is similar to print head assembly 414 described above except that print head assembly 814 comprises interface 830. Interface 830 comprises a nonmetal or polymer, such as an epoxy, having a thermal coefficient between that of printed circuit board 424 and compound 328 filled or backfilled into a gap of 731 between edges 432 of printed circuit board 424 and compound 328. In one implementation, gap 731 is formed along edges 432 during the molding of compound 328 about printed circuit board 424. In another implementation, gap 831 is formed by removal of portions of compound 328 along or adjacent, to edges 432 of printed circuit board 424. Interface 830 serves as a stress buffer as well as an adhesion layer for the compound 328. In one implementation, interface 830 have an elastic modulus less than 100 MPa_. In one implementation, interface 830 comprises an elastomer, which prior to curing, is in a liquid form, such as SIFEL2618 commercially available from Shin-Etsu. In yet other implementations interface 830 may comprise other materials.

Figure 12:
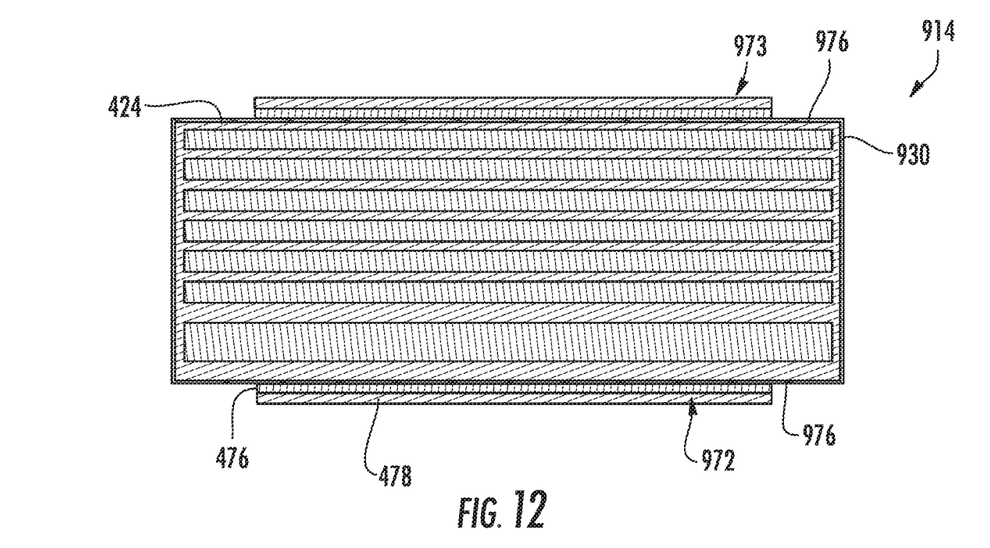
FIG. 12 is a sectional schematic diagram of an example printed circuit board and interface for use as part of the printing system of FIG. 4.
Figure 13:
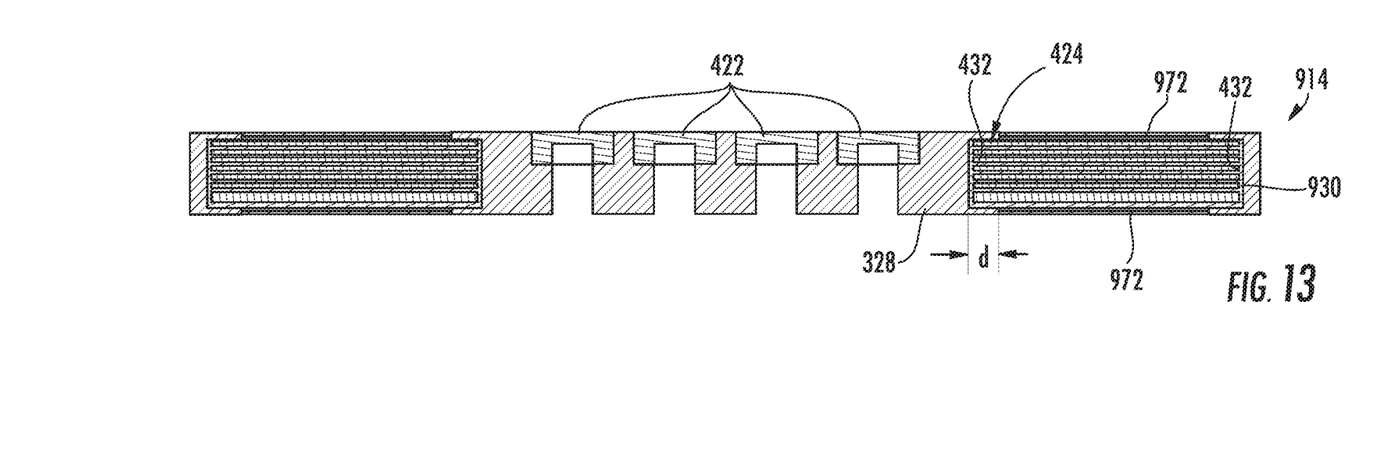
FIG. 13 is a sectional schematic diagram of a printed assembly including the printed circuit board and interface of FIG. 12 for use as part of the printing system of FIG. 4.

FIGS. 12 and 13 schematically illustrate portions of print head assembly 914 for use as part of printing system 300. Print head assembly 914 is similar to print head assembly 414 described above except that print head assembly 914 comprises interface 930 and mask or cover lays 972 in place of interface 430 and cover lay 472. FIG. 13 further schematically illustrates four fluid droplet ejection dies 422 within opening 354 within printed circuit board 424.

Interface 930 comprises a metal, such as copper, having a thermal coefficient between that of printed circuit board 424 and compound 328 plated otherwise apposite along edges 432 of printed circuit board 424. In the example illustrated, the metal layer of interface 930 continuously extends from edge 432 over each of faces 976 of printed circuit board 424. In the example illustrated in which interface 930 comprises a plated layer of copper, additional plated layers of nickel and gold are deposited upon the copper plating. The surface is "browned" or etched for roughening to enhance grip with compound 328 (shown in FIG. 13). As with the above-described interfaces, interface 930 serves as a barrier preventing diffusion into the layers of the printed circuit board 424 to prevent shorting of circuit traces.

Cover lay 972 extends on interface 930 on each of faces 976 of printed circuit board 424. In one implementation, cover lay 972 comprises a film adhesive upon which is deposited a polyimide. Cover lay 972 is offset from edges 432 by a distance d so as to form a shear lap joint with compound 328. In one implementation, the distance d is at least 100 um.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements.

What is claimed is:

1. An apparatus comprising:
   a printed circuit board having a first coefficient of thermal expansion;
   a compound molded about the printed circuit board, the compound having a second coefficient of thermal expansion different than the first coefficient of thermal expansion; and
   an interface between an edge of the printed circuit board and the compound, the interface having a third coefficient of thermal expansion between the first coefficient of thermal expansion and the second coefficient of thermal expansion.

2. The apparatus of claim 1, wherein the interface comprises an epoxy.

3. The apparatus of claim 1, wherein the interface comprises a metal.

4. The apparatus of claim 1, wherein the printed circuit board comprises:
   a first core layer;
   first electrically conductive traces on the first core layer;
   a second core layer;
   second electrically conductive traces on the second second ond core layer; and a pre-preg layer joining the first core layer to the second core layer.

5. The apparatus of claim 1, wherein the mold compound is in contact with a single epoxy or metal interface material next to the edge of the printed circuit board.

6. The apparatus of claim 1, wherein the interface is coated on the edge of the printed circuit board.

7. The apparatus of claim 1, wherein the interface is plated on the edge of the printed circuit board.

8. The apparatus of claim 1, wherein the interface is backfilled into a gap between the edge of the printed circuit board and the compound.

9. The apparatus of claim 1, further comprising:
a slot extending through the printed circuit board proximate the edge of the printed circuit board; and
a filler in the slot, the filler have an elastic modulus less than 100 MPa.

10. The apparatus of claim 1, wherein the interface continuously extends from the edge of the printed circuit board over a face of the printed circuit board and wherein the apparatus further comprises:
a coverlay on the interface on a face of the printed circuit board, the coverlay being set back from the edge of the printed circuit board to form a sheer lap joint with the compound.

11. A method comprising:
molding a compound about a printed circuit board, wherein the printed circuit board has a first coefficient of thermal expansion and wherein the compound has a second coefficient of thermal expansion different than the first coefficient of thermal expansion; and
forming an interface between an edge of the printed circuit board and the compound, the interface having a third coefficient of thermal expansion between the first coefficient of thermal expansion and the second coefficient of thermal expansion.

12. The method of claim 11, wherein the printed circuit board comprises a glass fiber epoxy laminate including electrically conductive traces, wherein the compound comprises an epoxy mold compound and wherein interface comprises an interface selected from a group of interfaces consisting of: copper and an epoxy.

13. The method of claim 11, wherein the interface continuously extends from the edge over a face of the printed circuit board and wherein the method further comprises forming a coverlay on the interface on the face of the printed circuit board, the coverlay being set back from the edge of the printed circuit board to form a sheer lap joint with the compound.

14. A print head assembly comprising:
a pen body;
a fluid droplet ejection die;
a printed circuit board having a first thermal coefficient of expansion;
a compound molded about the fluid droplet ejection die and the printed circuit board, the compound being secured to the pen body, wherein the compound has a second coefficient of thermal expansion different than the first coefficient of thermal expansion; and
an interface between an edge of the printed circuit board and the compound, the interface having a third coefficient of thermal expansion between the first coefficient of thermal expansion and the second coefficient of thermal expansion.

15. The print head assembly of claim 14 further comprising:
a slot through the printed circuit board proximate the edge of the printed circuit board; and
a filler within the slot have an elastic modulus of less than 100 MPa.

* * * * *

UNITED STATES PATENT AND TRADEMARK OFFICE
CERTIFICATE OF CORRECTION

PATENT NO. : 10,342,140 B2
APPLICATION NO. : 15/571015
DATED : July 2, 2019
INVENTOR(S) : Chien-Hua Chen et al.

Page 1 of 1

It is certified that error appears in the above-identified patent and that said Letters Patent is hereby corrected as shown below:

In the Claims

In Column 10, Lines 66-67, in Claim 4, delete "second second" and insert -- second --, therefor.

Signed and Sealed this
Tenth Day of December, 2019

Andrei Iancu
*Director of the United States Patent and Trademark Office*